US012593427B2

(12) United States Patent
Mohanta et al.

(10) Patent No.: US 12,593,427 B2
(45) Date of Patent: *Mar. 31, 2026

(54) ENHANCED CHANNEL CONFIGURATION FOR HEAT EXCHANGER TO COOL POWER ELECTRONICS

(71) Applicant: Carrier Corporation, Palm Beach Gardens, FL (US)

(72) Inventors: Lokanath Mohanta, Liverpool, NY (US); Arindom Joardar, Jamesville, NY (US); Srikanth Honavara Prasad, Manlius, NY (US); Konstantin Borisov, Avon, CT (US); Ismail Agirman, Southington, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 276 days.

This patent is subject to a terminal disclaimer.

(21) Appl. No.: 18/048,237

(22) Filed: Oct. 20, 2022

(65) Prior Publication Data

US 2023/0126158 A1 Apr. 27, 2023

Related U.S. Application Data

(60) Provisional application No. 63/272,298, filed on Oct. 27, 2021.

(51) Int. Cl.
*H05K 7/20* (2006.01)
*F28F 3/02* (2006.01)
(52) U.S. Cl.
CPC .......... *H05K 7/2089* (2013.01); *F28F 3/025* (2013.01); *H05K 7/20218* (2013.01); *F28F 2255/12* (2013.01)

(58) Field of Classification Search
CPC .. H05K 7/2089; H05K 7/209; H05K 7/20909; H05K 7/20936; H05K 7/20945;
(Continued)

(56) References Cited

U.S. PATENT DOCUMENTS 3,273,599 A * 9/1966 Heeren ..................... F28F 1/40
                                                            138/38
3,457,990 A * 7/1969 Theophilos ............... F28F 1/12
                                                            165/185
(Continued)

FOREIGN PATENT DOCUMENTS

CN          1558448 A      12/2004
CN      203349670 U  *  12/2013
(Continued)

OTHER PUBLICATIONS

Jin, Zun-long et al; "A Micro-Passage Heat Exchanger"; Dec. 18, 2013; Zhengzhou University; Description (Translation of CN 203349670 U found in PE2E Search) (Year: 2013).*
(Continued)

*Primary Examiner* — Jayprakash N Gandhi
(74) *Attorney, Agent, or Firm* — CANTOR COLBURN LLP

(57) ABSTRACT
A power electronics assembly includes one or more power electronics devices, and a heat exchanger to which the one or more power electronics devices are mounted. The heat exchanger includes an inlet manifold and an outlet manifold, and one or more fluid pathways extending connecting the inlet manifold and the outlet manifold, the heat exchanger configured to transfer thermal energy from the one or more power electronics devices into a flow of fluid passing through the one or more fluid pathways. Thee one or more fluid pathways include one or more internal enhancements and channel configurations to enhance thermal energy transfer by promoting boiling of the flow of fluid and to reduce
(Continued)

the pressure drop in the pathways under a two-phase flow condition. The flow of fluid is a flow of liquid refrigerant diverted from a condenser of a heating, ventilation, and air conditioning (HVAC) system.

19 Claims, 11 Drawing Sheets

(58) Field of Classification Search
CPC ..... F28F 3/025; F28F 2255/12; H01L 23/427; G06F 1/20
See application file for complete search history.

(56) References Cited

U.S. PATENT DOCUMENTS

| | | | | |
|---|---|---|---|---|
| 4,044,797 | A | * | 8/1977 | Fujie ..................... F28F 13/187 |
| | | | | 165/184 |
| 4,118,944 | A | * | 10/1978 | Lord ....................... F25B 39/02 |
| | | | | 165/184 |
| 4,314,742 | A | * | 2/1982 | Dye .......................... G02B 5/08 |
| | | | | 359/845 |
| 4,658,892 | A | * | 4/1987 | Shinohara ............. F28F 13/187 |
| | | | | 165/184 |
| 5,002,123 | A | | 3/1991 | Nelson et al. |
| 5,031,693 | A | * | 7/1991 | VanDyke ................ F28F 3/027 |
| | | | | 165/DIG. 393 |
| 5,040,596 | A | * | 8/1991 | Terasaki .................... F28F 3/02 |
| | | | | 165/185 |
| 5,465,782 | A | | 11/1995 | Sun et al. |
| 10,390,466 | B2 | * | 8/2019 | Held .................. H05K 7/20927 |
| 2002/0096314 | A1 | * | 7/2002 | Liu ......................... B21C 37/20 |
| | | | | 165/184 |
| 2003/0192669 | A1 | * | 10/2003 | Wu ..................... F28D 15/0241 |
| | | | | 165/46 |
| 2004/0112585 | A1 | * | 6/2004 | Goodson ............... F04B 19/006 |
| | | | | 165/80.4 |
| 2007/0119572 | A1 | * | 5/2007 | Weber ................. H01L 23/4735 |
| | | | | 257/E23.105 |
| 2008/0047696 | A1 | * | 2/2008 | Sperandei ............... F28F 3/027 |
| | | | | 165/177 |

| | | | | |
|---|---|---|---|---|
| 2009/0260789 | A1 | * | 10/2009 | Sperandei ............... F28F 13/12 |
| | | | | 165/177 |
| 2009/0302458 | A1 | | 12/2009 | Kubo et al. |
| 2010/0147492 | A1 | * | 6/2010 | Conry ................... H01L 23/427 |
| | | | | 165/104.31 |
| 2010/0328888 | A1 | * | 12/2010 | Campbell ........... H01L 23/4735 |
| | | | | 361/699 |
| 2011/0079376 | A1 | | 4/2011 | Loong et al. |
| 2011/0203777 | A1 | | 8/2011 | Zhao et al. |
| 2012/0255318 | A1 | * | 10/2012 | Kido ..................... F25B 31/006 |
| | | | | 62/126 |
| 2012/0312046 | A1 | * | 12/2012 | Kim .......................... F24F 1/24 |
| | | | | 62/259.2 |
| 2013/0056176 | A1 | | 3/2013 | Valenzuela |
| 2014/0145107 | A1 | * | 5/2014 | Bromberg ............ B01J 37/0225 |
| | | | | 165/185 |
| 2014/0158324 | A1 | | 6/2014 | Tochiyama et al. |
| 2016/0381839 | A1 | * | 12/2016 | Farshchian ........... H01L 23/473 |
| | | | | 165/104.21 |
| 2017/0051987 | A1 | * | 2/2017 | Vanerwees ........ H01M 10/6556 |
| 2017/0064866 | A1 | | 3/2017 | Wang et al. |
| 2017/0245402 | A1 | * | 8/2017 | Borisov ............. H05K 7/20927 |
| 2018/0098458 | A1 | * | 4/2018 | Chainer ............. H05K 7/20254 |
| 2018/0100710 | A1 | * | 4/2018 | Chainer ............. H05K 7/20309 |
| 2019/0020175 | A1 | * | 1/2019 | Takigawa ............ H01S 5/02423 |
| 2019/0195541 | A1 | * | 6/2019 | Moore .................... F25B 39/02 |
| 2020/0221611 | A1 | * | 7/2020 | Kobayashi ......... H05K 7/20936 |
| 2020/0373223 | A1 | * | 11/2020 | Chehade ............... F28D 9/0031 |
| 2023/0025136 | A1 | * | 1/2023 | Yamada ............... F25B 49/022 |

FOREIGN PATENT DOCUMENTS

| | | |
|---|---|---|
| CN | 104465562 A | 3/2015 |
| CN | 108225079 A | 6/2018 |

OTHER PUBLICATIONS

European Office Action for European Application No. 22204232.7; dated Mar. 14, 2024; 33 pages.
European Search Report for European Application No. 22204232.7; dated Feb. 21, 2023, 131 pages.

* cited by examiner

ENHANCED CHANNEL CONFIGURATION FOR HEAT EXCHANGER TO COOL POWER ELECTRONICS

CROSS-REFERENCE TO RELATED APPLICATIONS

This application claims the benefit of U.S. Provisional Patent Application No. 63/272,298 filed Oct. 27, 2021, the disclosure of which is incorporated herein by reference in its entirety.

BACKGROUND

Exemplary embodiments pertain to the art of heat exchangers, and more particularly to heat exchangers for cooling power electronics.

Power electronics devices such as motor drives generate waste heat during operation of the device. Additionally, when the power electronics devices heat up the operational efficiency of the devices can degrade adding to the amount of heat generated. When utilized in a refrigeration system to drive, for example, a compressor of the refrigeration system, effective thermal integration of these devices can be important aspect to the system's overall efficiency and reliability. Consequently, a goal of the system integrator is to maintain these components within a range of operating temperatures which will maximize the system efficiency. Accordingly, there remains a need in the art for heat exchangers configured to closely integrate with power electronic devices which can maintain optimal temperatures for these components under a variety of load conditions. Further, it is desired to increase capacity of such heat exchangers while reducing a pressure drop impact.

BRIEF DESCRIPTION

In one embodiment, a power electronics assembly includes one or more power electronics devices, and a heat exchanger to which the one or more power electronics devices are mounted. The heat exchanger includes an inlet manifold and an outlet manifold, and one or more fluid pathways extending connecting the inlet manifold and the outlet manifold, the heat exchanger configured to transfer thermal energy from the one or more power electronics devices into a flow of fluid passing through the one or more fluid pathways. Thee one or more fluid pathways include one or more internal enhancements and channel configurations to enhance thermal energy transfer by promoting boiling of the flow of fluid and to reduce the pressure drop in the pathways under a two-phase flow condition. The flow of fluid is a flow of liquid refrigerant diverted from a condenser of a heating, ventilation, and air conditioning (HVAC) system.

Additionally or alternatively, in this or other embodiments the one or more fluid pathways have a wavy shape along a length of the one or more fluid pathways.

Additionally or alternatively, in this or other embodiments the one or more internal enhancements include one or more inclined notches formed in the one or more fluid pathways.

Additionally or alternatively, in this or other embodiments the notch is oriented at a notch angle of between 30 and 60 degrees relative to the flow of fluid through the one or more fluid pathways.

Additionally or alternatively, in this or other embodiments a cross-sectional area of the one or more fluid pathways increases along the flow direction of the flow of fluid from the pathway inlet to a pathway outlet.

Additionally or alternatively, in this or other embodiments a heat exchanger outlet has a larger cross-sectional area than a heat exchanger inlet.

Additionally or alternatively, in this or other embodiments a wavy plate is located in the fluid pathway extending at least partially across the fluid pathway.

Additionally or alternatively, in this or other embodiments the wavy plate includes a plurality of perforations along at least a partial length of the fluid pathway.

Additionally or alternatively, in this or other embodiments one or more of a perforation number or perforation size increases from a fluid pathway inlet to a fluid pathway outlet by reducing the flow restrictions along the flow direction of the flow of fluid under the two-phase flow condition.

Additionally or alternatively, in this or other embodiments the heat exchanger is formed from a first plate including a first pathway portion of the one or more fluid pathways and a second plate including a second pathway portion of the one or more fluid pathways.

Additionally or alternatively, in this or other embodiments the first pathway portion is vertically offset from the second pathway portion.

In another embodiment, a method of cooling one or more power electronics devices includes securing the one or more power electronics devices to a heat exchanger, the heat exchanger including one or more fluid pathways. A flow of fluid is circulated through one or more fluid pathways to transfer thermal energy from the one or more power electronics devices to the flow of fluid passing through the one or more fluid pathways. The one or more fluid pathways include one or more internal enhancements and channel design to enhance thermal energy transfer by promoting boiling of the flow of fluid and to reduce the pressure drop in the pathways under two-phase flow condition. The flow of fluid is a flow of liquid refrigerant diverted from a condenser of a heating, ventilation, and air conditioning (HVAC) system.

Additionally or alternatively, in this or other embodiments the one or more fluid pathways have a wavy shape along a length of the one or more fluid pathways.

Additionally or alternatively, in this or other embodiments the one or more internal enhancements include one or more notches formed in the one or more fluid pathways, the one or more notches oriented at a notch angle of between 30 and 60 degrees relative to the flow of fluid through the one or more fluid pathways.

Additionally or alternatively, in this or other embodiments a cross-sectional area of the one or more fluid pathways increases from a pathway inlet to a pathway outlet.

Additionally or alternatively, in this or other embodiments a heat exchanger outlet has a greater cross-sectional area than a heat exchanger inlet.

Additionally or alternatively, in this or other embodiments a wavy plate is located in the fluid pathway.

Additionally or alternatively, in this or other embodiments the wavy plate includes a plurality of perforations.

Additionally or alternatively, in this or other embodiments one or more of a perforation number or perforation size increases from a fluid pathway inlet to a fluid pathway outlet.

Additionally or alternatively, in this or other embodiments the heat exchanger is formed from a first plate including a first pathway portion of the one or more fluid pathways and a second plate including a second pathway portion of the one or more fluid pathways, and the first pathway portion is vertically offset from the second pathway portion.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
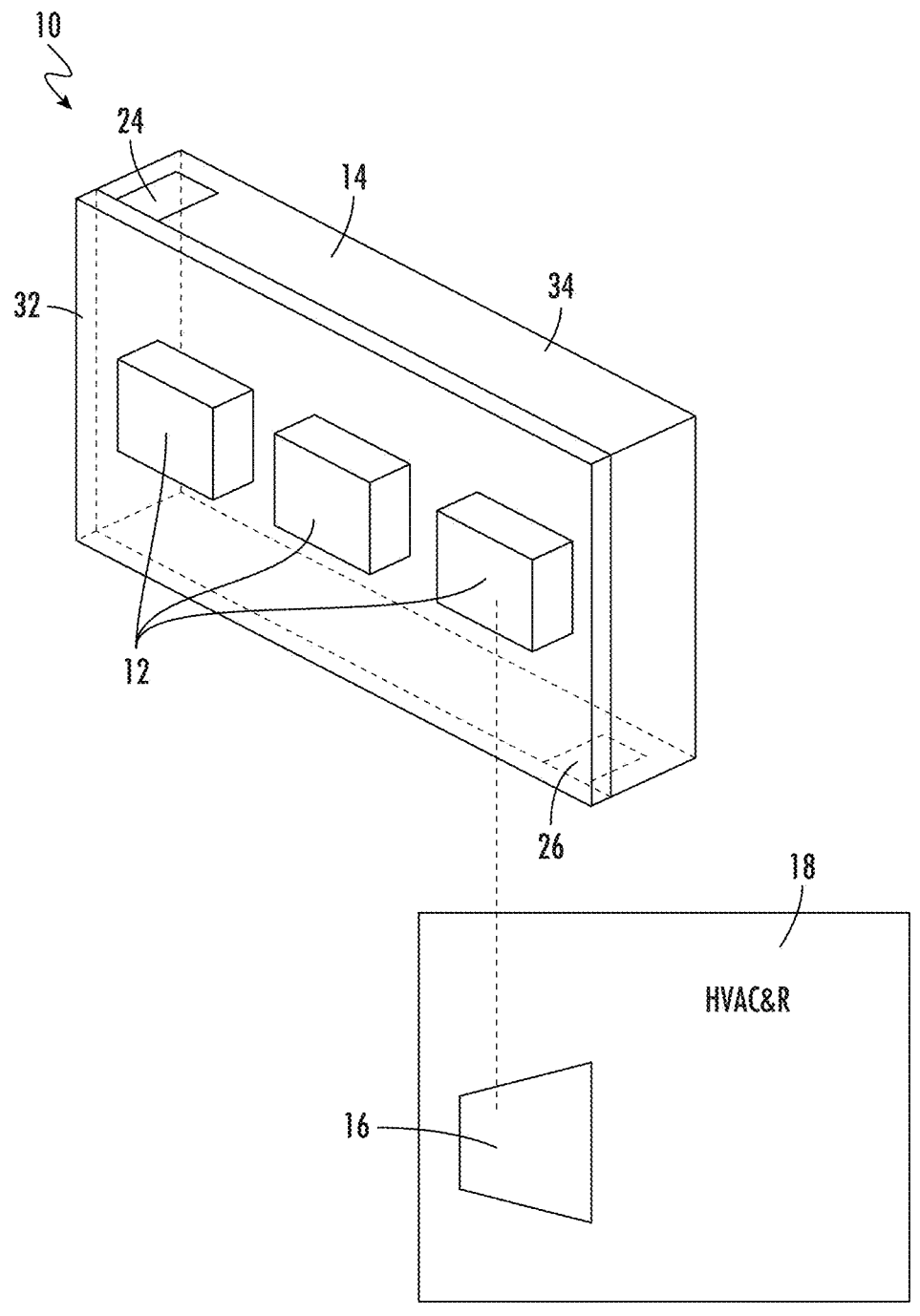
FIG. 1 is an illustration of an embodiment of an exemplary power electronics assembly.

Illustrated in FIG. 1 is an embodiment of a power electronics assembly 10. The power electronics assembly 10 includes one or more power electronics devices 12 mounted to a heat exchanger 14 utilized to reject and dissipate thermal energy generated by the power electronics devices 12 during operation. In some embodiments, the power electronics devices 12 include a variable frequency drive (VFD) operably connected to a compressor 16 of a heating, ventilation, and air conditioning (HVAC) system 18.

Figure 2:
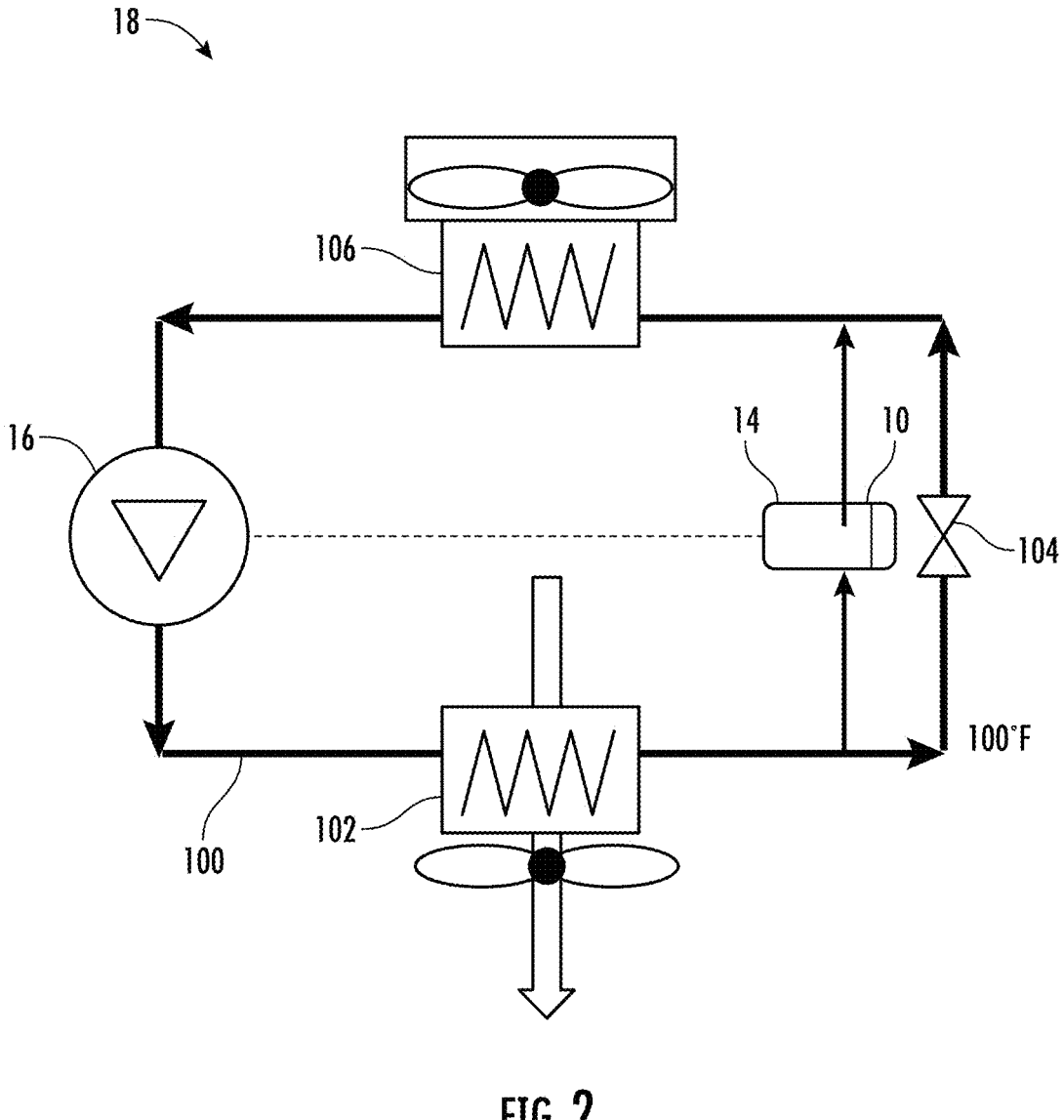
FIG. 2 is an illustration of an embodiment of an exemplary heating, ventilation, and air conditioning (HVAC) system.

Referring to FIG. 2, the HVAC system 18 includes, for example, a vapor compression circuit 100 including the compressor 16, a condenser 102, an expansion device 104 and an evaporator 106 arranged in series and having a volume of refrigerant flowing therethrough. The power electronics assembly 10 is connected to the vapor compression circuit 100 such that a portion of the flow of liquid refrigerant exiting the condenser 102 is diverted through the heat exchanger 14, bypassing the expansion device 104 and is directed from the heat exchanger 14 to the evaporator 106. The liquid refrigerant from the condenser 102 absorbs thermal energy generated by the power electronics devices 12. This thermal energy generated by the power electronics devices 12 may cause the refrigerant passing through the heat exchanger 14 to boil, changing phase of the refrigerant from liquid to vapor inside the heat exchanger 14.

Figure 3:
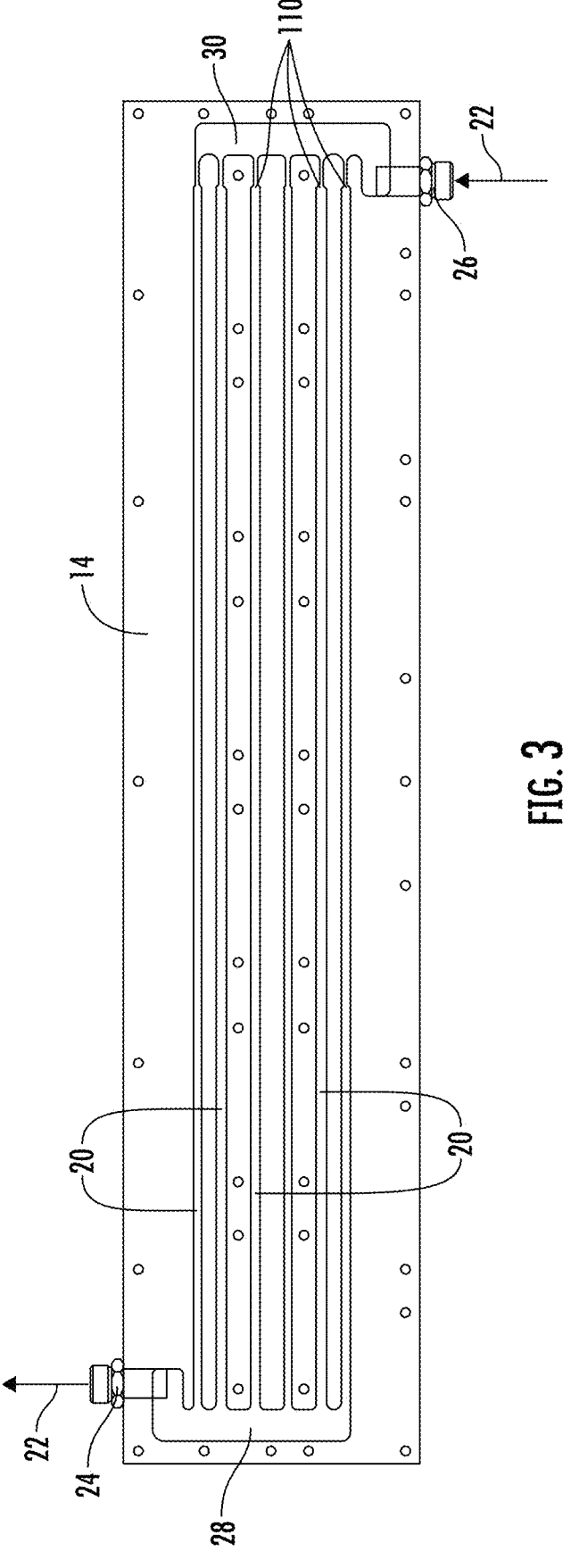
FIG. 3 is an illustration of an embodiment of an exemplary heat exchanger of a power electronics assembly.

Referring now to FIG. 3, an exemplary heat exchanger 14 is illustrated in more detail. As shown, the heat exchanger 14 includes a plurality of enclosed fluid pathways 20 extending therethrough, enabling a flow of fluid 22 such as, for example, refrigerant, glycol, or water to flow therein. The fluid pathways 20 extend between a heat exchanger inlet 26 through which the flow of fluid 22 enters the heat exchanger 14, and a heat exchanger outlet 24 through which the flow of fluid 22 exits the heat exchanger 14. In some embodiments, the heat exchanger outlet 24 is oriented vertically upwardly as shown to prevent vapor lock in the heat exchanger 14 flow path under boiling condition. The heat exchanger inlet 26 is connected to the fluid pathways 20 via an inlet manifold 30 to distribute the flow of fluid 22 to the fluid pathways 20, and similarly the heat exchanger outlet 24 is connected to the fluid pathways 20 via an outlet manifold 28. Immediately downstream of the inlet manifold 30, orifices 110 of different diameters, increasing with increasing distance from the heat exchanger inlet 26 are provided to distribute the flow of fluid 22 from the inlet manifold 30 equally among all of the fluid pathways 20. The enhancement features described in the following text will be in the fluid pathways 20 downstream of the respective orifices 110.

In some embodiments, the heat exchanger 14 is formed from a metal material, such as aluminum, aluminum alloy, steel, steel alloy, copper, copper alloy, or the like, and referring again to FIG. 1, may be formed from two or more plates 32, 34 abutting one another along a side and joined using any suitable means such as brazing, welding, clamping, compressing, bolting, and the like. The plates 32, 34 may each include a portion of the fluid pathways 20, the inlet manifold 30, the outlet manifold 28, the heat exchanger inlet 26 and/or the heat exchanger outlet 24 formed therein. The mating surfaces of the plates 32, 34 can be configured to correspond to one another, e.g., to fit together and seal the fluid circuit therebetween. The mating surfaces of the plates 32, 34 can include precision surfaces formed from a process having highly accurate and precise dimensional control, such as through computer numerical control (CNC) machining process and/or net shape, or near net shape manufacturing process. Optionally or additionally, a sealing material can be disposed between the plates 32, 34 to aide in preventing leakage from the fluid circuit.

In operation, the flow of fluid 22, liquid refrigerant from the condenser 102, enters the heat exchanger 14 at the heat exchanger inlet 26 and is distributed to the fluid pathways 20 via the inlet manifold 30. The heat exchanger 14 conducts thermal energy from the power electronics devices 12 and thermal energy is exchanged with the flow of fluid 22 flowing through the fluid pathways 20, resulting in cooling of the power electronics devices 12. The vapor flow of fluid 22 is then collected at the outlet manifold 28 and exits the heat exchanger 14 at the heat exchanger outlet 24.

The heat exchanger 14 described herein includes one or more features, as will be described below, to improve heat transfer capacity of the heat exchanger 14 while reducing a pressure drop penalty of operation of the heat exchanger 14. While the features are described independently below, one skilled in the art will readily appreciate that the features may be incorporated into the heat exchanger 14 either independently or in combinations of two or more of the features to promote nucleate boiling heat transfer and to reduce pressure drop under two-phase flow condition while quality increases along the flow direction. The flow of fluid 22 provided to the heat exchanger 14 is diverted from the condenser 102 and in some embodiments enters the heat exchanger 14 in a liquid phase with 0% vapor quality or up to 20% vapor quality. The presently disclosed heat exchanger 14 may be operated to ensure the vapor quality of the flow of fluid 22 exiting the heat exchanger 14 has a vapor quality of from about 25% to about 80%, or in another embodiment from about 40% to about 60%, or in yet another embodiment from about 45% to about 55%, or about 50%. The vapor quality change happens as the heat from power electronics devices 12 is absorbed by the flow and used for phase change of the liquid refrigerant to vapor while travelling from the heat exchanger inlet 26 to the heat exchanger outlet 24.

Figure 4:
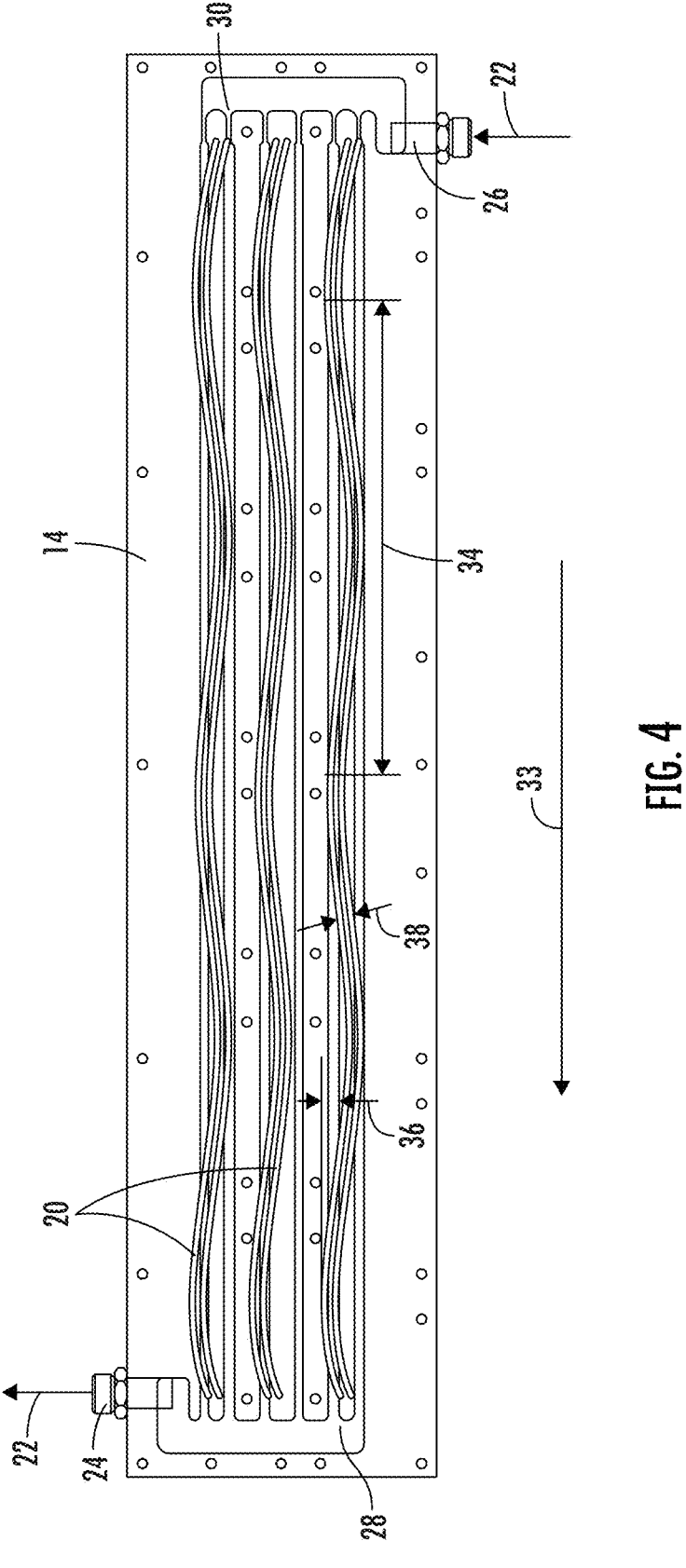
FIG. 4 is an illustration of an embodiment of an exemplary heat exchanger having wavy fluid pathways along a heat exchanger length.
Figure 4A:
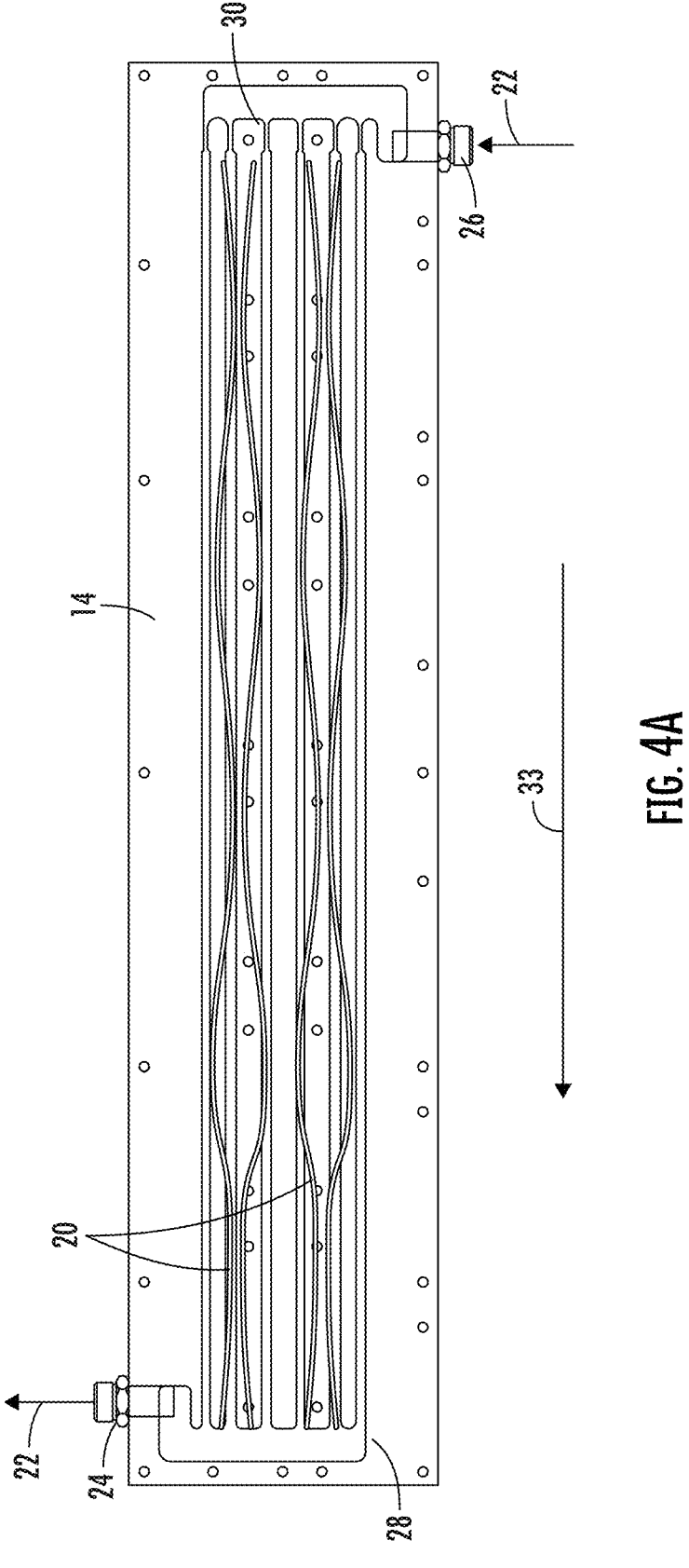
FIG. 4A an illustration of another embodiment of an exemplary heat exchanger having wavy fluid pathways along a heat exchanger length.

Referring now to FIG. 4 the fluid pathways 20 of the heat exchanger 14 may be formed to increase heat transfer area along a heat exchanger length 33. The fluid pathways 20 may have a wavy shape along the heat exchanger length. In some embodiments, the wavy shape is a sinusoidal shape, but it is to be appreciated that other shapes may be utilized. In some embodiments, a peak-to-peak wavelength 35 of the fluid pathway 20 is in the range of 100 millimeters to 300 millimeters, while an amplitude 36 of the wave shape is in the range of 0.5 to 1.5 times a pathway diameter 38 of the fluid pathway 20. The wave shape may extend along an entire length of the fluid pathway 20, while in some embodiments the wave shape may extend along only a portion of the length of the fluid pathway 20. While in the configuration of FIG. 4, the wavy shapes of adjacent fluid pathways 20 are in phase such that the fluid pathways 20 extend parallelly, in other embodiments such as shown in FIG. 4A the wavy shapes of the fluid pathways are out of phase, or opposed such that the flow area changes periodically along the length of the heat exchanger 14.

Figure 5:
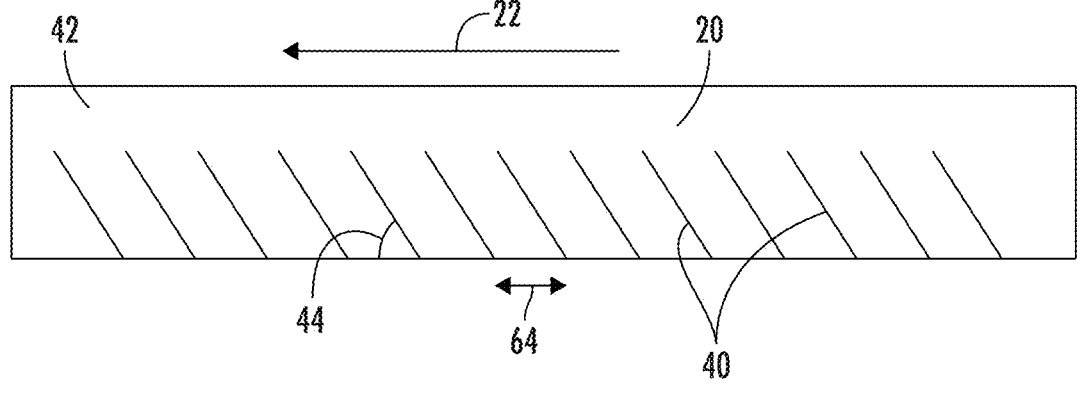
FIG. 5 is a schematic illustration of an embodiment of an exemplary fluid pathway of a heat exchanger having a plurality of notches.
Figure 6:
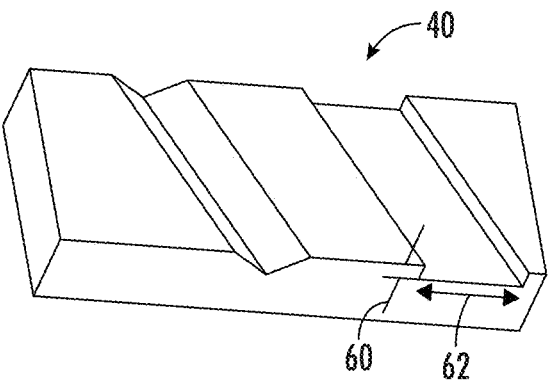
FIG. 6 is a schematic illustration of an embodiment of an exemplary fluid pathway notch.

The fluid pathways 20 may have heat transfer enhancement features formed therein. For example, as shown in FIGS. 5 and 6, the fluid pathways 20 may have notches 40 or grooves formed in a pathway wall 42 at a notch angle 44 relative to the direction of fluid flow through the fluid pathway 20. The notches 40 aid in spreading the flow of fluid 22 along the Notches will help spreading the liquid along the pathway wall 42 thereby keeping the pathway wall 42 wet, and promoting nucleate boiling at the pathway wall 42. Further, the notches 40 promote turbulence in the flow of fluid 22 to increase mixing of the flow of fluid 22. In some embodiments the notches 40 extend unbroken around an entire circumference of the fluid pathway 20, while in other embodiments the notches 40 are segmented and extend only a selected circumferential angle around the fluid pathway 20. In some embodiments, a notch depth 60 is in the range of 300-700 micron. A notch width 62 may be in the range of 200-2000 micron, while a notch pitch 64 between adjacent notches 40 may be in the range of 400-5000 microns. In some embodiments, the notch angle 44 is between 30 degrees and 60 degrees. While in the embodiments illustrated herein the notches 40 have a rectangular shape, other shapes such a triangular to semicircular, for example, may be utilized.

Figure 7A:
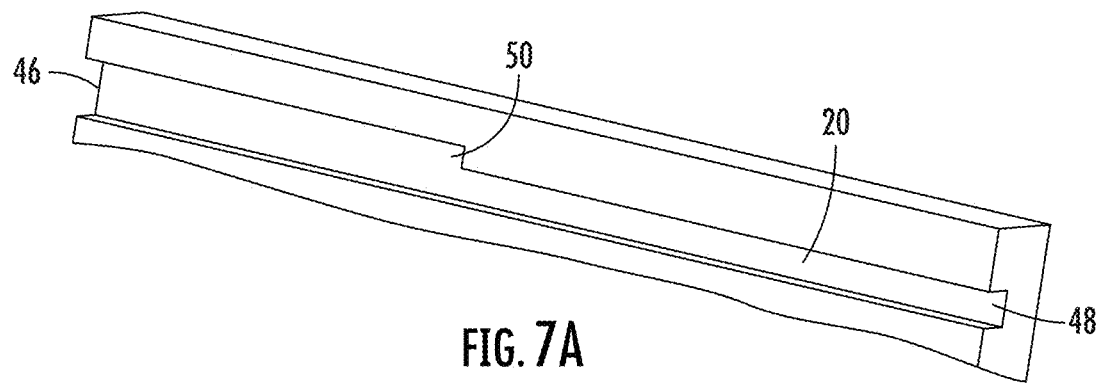
FIG. 7a illustrates an embodiment of an exemplary fluid pathway having an increasing cross-sectional area along a fluid pathway length.
Figure 7B:
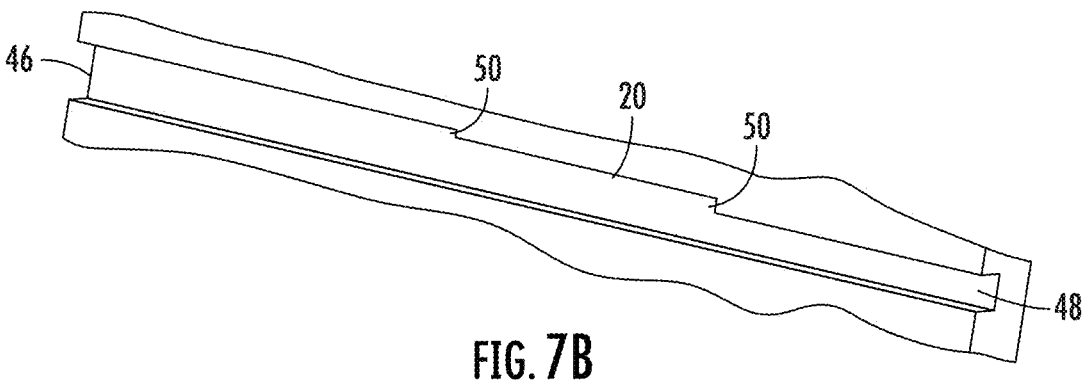
FIG. 7b illustrates another embodiment of an exemplary fluid pathway having an increasing cross-sectional area along a fluid pathway length.
Figure 7C:
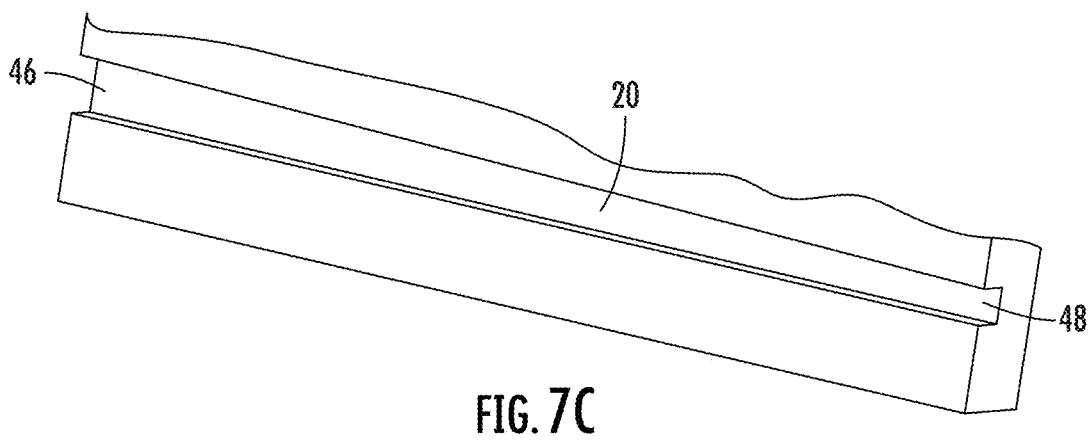
FIG. 7c illustrates yet another embodiment of an exemplary fluid pathway having an increasing cross-sectional area along a fluid pathway length.

Referring now to FIGS. 7a-7c, the fluid pathways 20 may have an increasing cross-sectional area, such that an outlet cross-sectional area 46 at the outlet manifold 30 is greater than an inlet cross-sectional area 48 at the inlet manifold 28. The change in cross-sectional area may be achieved by one or more steps 50 formed in the fluid pathway as in FIGS. 7a and 7b, or alternatively may be a gradual, continuous increase in area as illustrated in FIG. 7c. The area change will help in reducing the pressure drop in the fluid pathways 20 as volume of vapor flow under two-phase condition increases from inlet to outlet.

Figure 8:
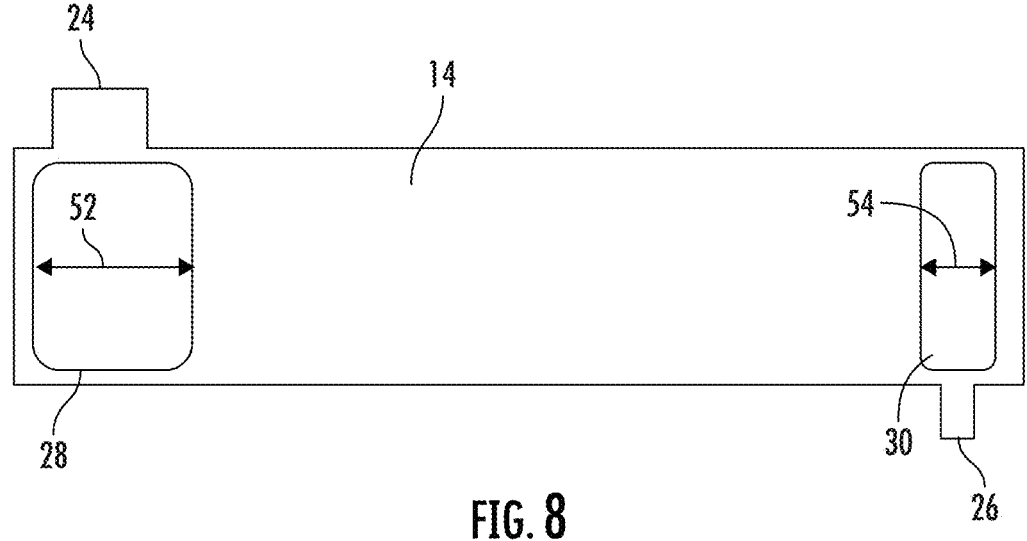
FIG. 8 is a first view of an embodiment of an exemplary heat exchange having an outlet with a larger cross-sectional area than the inlet.
Figure 9:
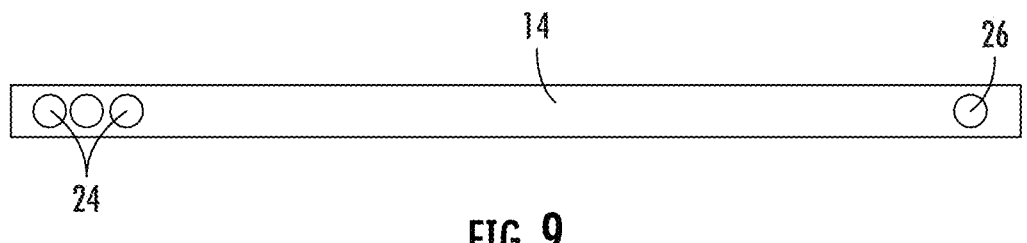
FIG. 9 is a second view of an embodiment of an exemplary heat exchanger having an outlet with a larger cross-sectional area that the inlet.

Referring now to FIGS. 8 and 9, the outlet manifold 28 may be sized relative to the inlet manifold 30 to account for the increased vapor volume at the outlet manifold 28. For example, the outlet manifold 28 may have a larger hydraulic diameter 52 than the inlet manifold hydraulic diameter 54. Similarly, the heat exchanger outlet 24 may be sized to have a larger flow area than the heat exchanger inlet 26 to similarly account for the increased vapor volume under two-phase condition at the heat exchanger outlet 24 to reduce the pressure drop along the heat exchanger 26.

Figure 10:
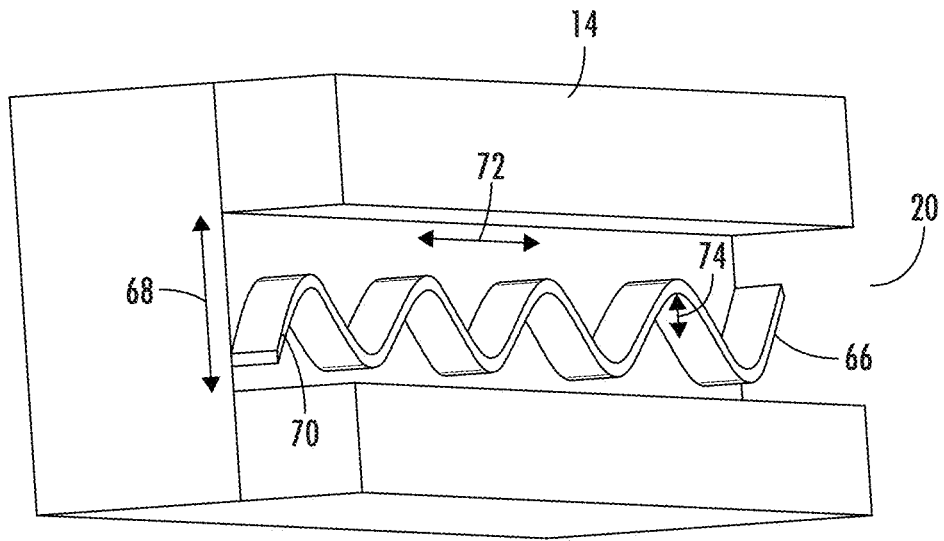
FIG. 10 illustrates an embodiment of an exemplary fluid pathway having a wavy plate disposed therein.

Referring now to FIG. 10, in some embodiments a wavy plate 66 is disposed in the fluid pathway 20 extending partially across a pathway height 68. In some embodiments, the wavy plate 66 extends between 25 and 75 percent across the pathway height 68. In some embodiments the wavy plate 66 has a plate thickness 70 between 0.1-0.5 millimeters. The wavy plate 66 may have a plate wavelength 72 between 50-200 millimeters, and/or a plate amplitude 74 between about 10 percent and 40 percent of the pathway height 68, i.e., covering 20 to 80% of the pathway height. The wavy plate 66 increases turbulence and mixing of the flow of fluid 22 in the fluid pathway 20. The wavy plate 70 can either cover the partial length of the pathway 20 or the entire length of the pathway 20. In addition, the wavy plate 66 can be installed perpendicular to face 68 (vertical face) or it can be inclined at an angle 45-90 deg. This would help draining of the liquid towards the heated wall, so it will keep the wall wet and enhance nucleate boiling. Also, the meniscus formed at the junction of the waveplate and trough of the wave would assist in thin film evaporation.

Figure 11:
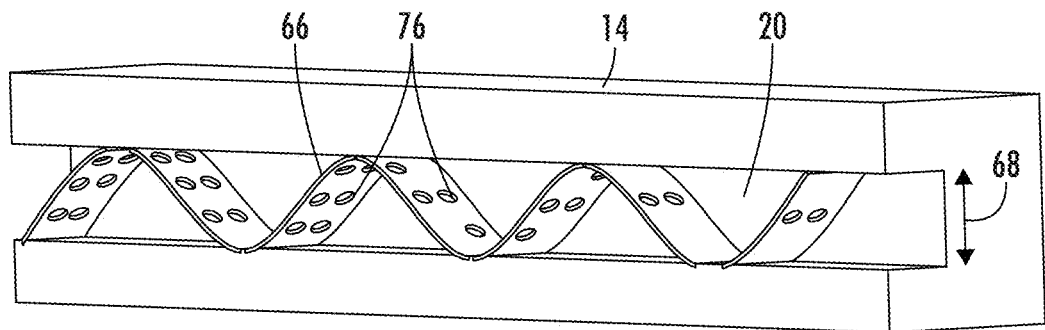
FIG. 11 illustrates an embodiment of an exemplary fluid pathway having a wavy plate therein that includes a plurality of perforations.

Referring now to FIG. 11, in some embodiments the wavy plate 66 extends entirely across the pathway height 68 and includes a plurality of perforations 76 formed therein. In some embodiments, the perforations 76 are between 0.5 millimeters and 2 millimeters in diameter. The wavy plate 66 may be configured such that an open area for the flow of fluid 22 through wavy plate 66 increases along the flow direction of the flow of fluid 22 along the fluid pathway 20. This may be accomplished by increasing the number of perforations 76 and/or increasing the size of the perforations 76. The area change will help in reducing the pressure drop in the fluid pathway 20 as volume of vapor flow increases from inlet to outlet under two-phase boiling condition. More number of perforations 76 also results in higher heat transfer area and improve the heat transfer performance. In addition, to manage the pressure drop, the number of perforations 76 near the entrance of the fluid pathway 20 can be increased and relative to that flow area must increase along the length. The wavy plate 66 can either cover the partial length of the fluid pathway 20 or the entire length of the fluid pathway 20. This would help in reduce the pressure drop resistance.

Figure 12:
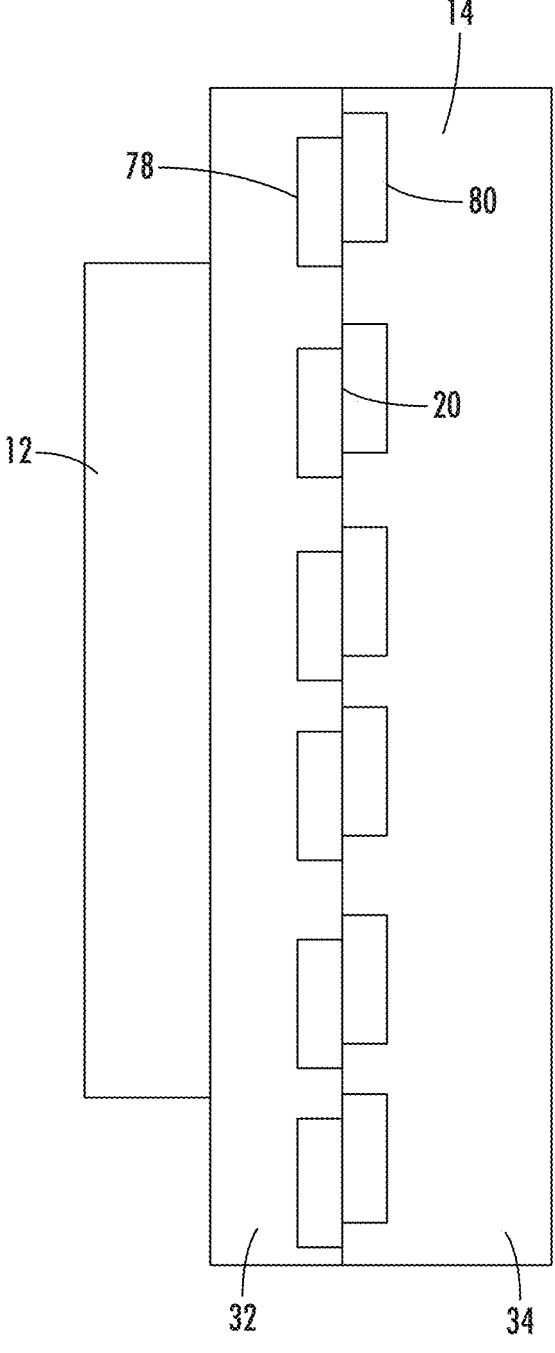
FIG. 12 illustrates an embodiment of an exemplary fluid pathway of a heat exchanger having vertically offset pathway portions.
Figure 13:
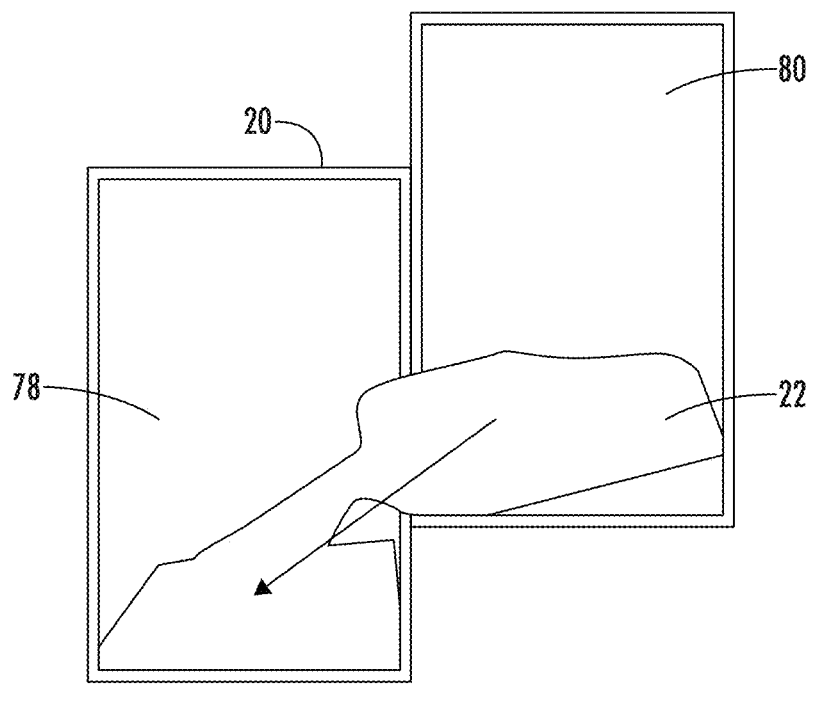
FIG. 13 illustrates the flow of fluid between vertically offset pathway portions, as shown in FIG. 12.
Figure 14:
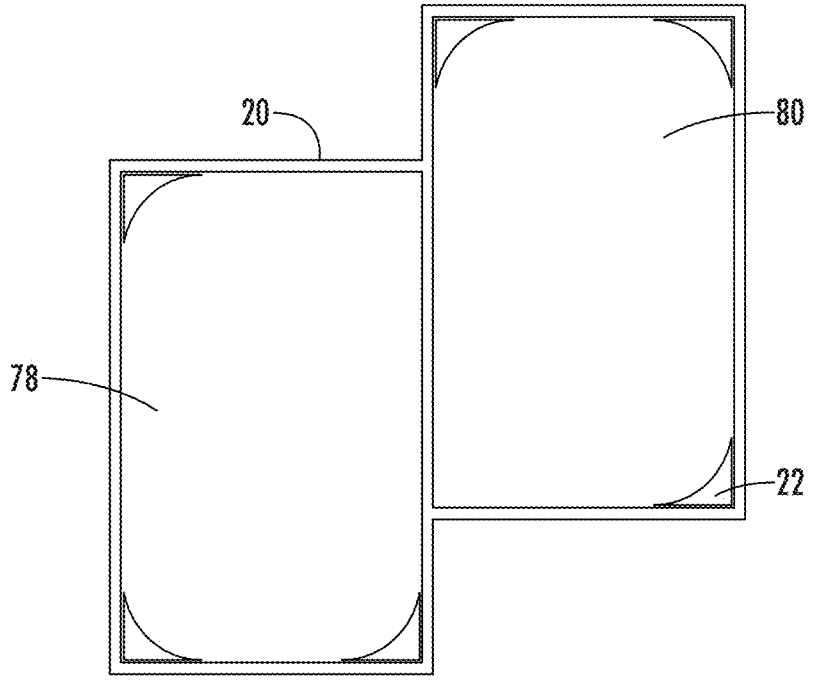
FIG. 14 illustrates an embodiment of an exemplary fluid pathway having one or more sharp corners.

As shown in FIG. 12, in a heat exchanger 14 having a two plate 32, 34 construction, each plate 32, 34 has a portion of the fluid pathway 20 formed therein. A first pathway portion 78 formed in the first plate 32 may be offset in a vertical direction relative to a second pathway portion 80 formed in the second plate 34. The offset of the first pathway portion 78 and the second pathway portion 80 may be between 20 percent and 70 percent of the pathway height 68, and may be biased such that the first plate 32 has the power electronics devices 12 mounted thereto, and the first pathway portions 78 are vertically lower than the second pathway portions 80. This arrangement aids in directing the flow of liquid into the first pathway portions 78 closer to the power electronics devices 12 as shown in FIG. 13, so the vapor is pushed away from the portion 78 to portion 80, thereby improving heat transfer effectiveness by increasing nucleate boiling in the first pathway 78 and also preventing the first pathway portions 78 from drying out. Further, the fluid pathways 20 may be provided with additional two or more corners as shown in FIG. 14 to promote thin film evaporation when the flow will be transitioned to annular flow. The corners of the fluid pathways 20 will have a liquid meniscus that will promote thin film evaporation.

The enhanced features of the heat exchanger 14 as disclosed herein promote convective flow boiling for high heat transfer rate, reduced pressure drop and improved compactness of the heat exchanger 14.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A power electronics assembly, comprising:
one or more power electronics devices; and
a heat exchanger to which the one or more power electronics devices are mounted, the heat exchanger comprising:

an inlet manifold and an outlet manifold; and
one or more fluid pathways extending connecting the inlet manifold and the outlet manifold, the heat exchanger configured to transfer thermal energy from the one or more power electronics devices into a flow of fluid passing through the one or more fluid pathways;
wherein the one or more fluid pathways include one or more internal enhancements and channel configurations to enhance thermal energy transfer by promoting boiling of the flow of fluid and to reduce a pressure drop in the one or more fluid pathways under a two-phase flow condition;
wherein the flow of fluid is a flow of liquid refrigerant diverted from a condenser of a heating, ventilation, and air conditioning (HVAC) system;
wherein the one or more internal enhancements include one or more inclined notches formed in the one or more fluid pathways, the one or more inclined notches extending unbroken around an entire circumference of an internal perimeter of the one or more fluid pathways; and
wherein each of the one or more inclined notches has a rectangular cross-sectional shape, and are oriented to extend across the fluid pathway relative to a direction of the flow of fluid along the one or more fluid pathways.

2. The power electronics assembly of claim 1, wherein the one or more fluid pathways have a wavy shape along a length of the one or more fluid pathways.

3. The power electronics assembly of claim 1, wherein a notch of the one or more inclined notches is oriented at a notch angle of between 30 and 60 degrees relative to the flow of fluid through the one or more fluid pathways.

4. The power electronics assembly of claim 1, wherein a cross-sectional area of the one or more fluid pathways increases along a flow direction of the flow of fluid from a pathway inlet to a pathway outlet.

5. The power electronics assembly of claim 1, wherein a heat exchanger outlet has a larger cross-sectional area than a heat exchanger inlet.

6. The power electronics assembly of claim 1, further comprising a wavy plate disposed in each fluid pathway of the one or more fluid pathways extending at least partially across the fluid pathway.

7. The power electronics assembly of claim 6, wherein the wavy plate includes a plurality of perforations along at least a partial length of the fluid pathway.

8. The power electronics assembly of claim 7, wherein one or more of a perforation number or perforation size of the plurality of perforations increases from a fluid pathway inlet to a fluid pathway outlet by reducing the flow restrictions along a flow direction of the flow of fluid under the two-phase flow condition.

9. The power electronics assembly of claim 1, wherein the heat exchanger is formed from a first plate including a first pathway portion of the one or more fluid pathways and a second plate including a second pathway portion of the one or more fluid pathways.

10. The power electronics assembly of claim 9, wherein the first pathway portion is vertically offset from the second pathway portion.

11. A method of cooling one or more power electronics devices, comprising:
securing the one or more power electronics devices to a heat exchanger, the heat exchanger comprising one or more fluid pathways;

circulating a flow of fluid through the one or more fluid pathways to transfer thermal energy from the one or more power electronics devices to the flow of fluid passing through the one or more fluid pathways;

wherein the one or more fluid pathways include one or more internal enhancements and channel design to enhance thermal energy transfer by promoting boiling of the flow of fluid and to reduce a pressure drop in the one or more fluid pathways under a two-phase flow condition;

wherein the flow of fluid is a flow of liquid refrigerant diverted from a condenser of a heating, ventilation, and air conditioning (HVAC) system;

wherein the one or more internal enhancements include one or more inclined notches formed in the one or more fluid pathways, the one or more inclined notches extending unbroken around an entire circumference of an internal perimeter of the one or more fluid pathways; and the one or more inclined notches having a rectangular cross-sectional shape and being oriented to extend across the fluid pathway relative to a direction of the flow of fluid along the one or more fluid pathways.

12. The method of claim 11, wherein the one or more fluid pathways have a wavy shape along a length of the one or more fluid pathways.

13. The method of claim 11, the one or more notches are oriented at a notch angle of between 30 and 60 degrees relative to the flow of fluid through the one or more fluid pathways.

14. The method of claim 11, wherein a cross-sectional area of the one or more fluid pathways increases from a pathway inlet to a pathway outlet.

15. The method of claim 11, wherein a heat exchanger outlet has a greater cross-sectional area than a heat exchanger inlet.

16. The method of claim 11, further comprising a wavy plate disposed in the fluid pathway.

17. The method of claim 16, wherein the wavy plate includes a plurality of perforations.

18. The method of claim 17, wherein one or more of a perforation number or perforation size of the plurality of perforations increases from a fluid pathway inlet to a fluid pathway outlet.

19. The method of claim 11, wherein:

the heat exchanger is formed from a first plate including a first pathway portion of the one or more fluid pathways and a second plate including a second pathway portion of the one or more fluid pathways; and the first pathway portion is vertically offset from the second pathway portion.

* * * * *